United States Patent [19]

Burnett et al.

[11] 4,281,323

[45] Jul. 28, 1981

[54] NOISE RESPONSIVE DATA INPUT APPARATUS AND METHOD

[75] Inventors: Bradley W. Burnett, Hobart, Ind.; Charles E. Fiterman; Leonard A. Fish, both of Chicago, Ill.

[73] Assignee: Bank Computer Network Corporation, Schiller Park, Ill.

[21] Appl. No.: 966,739

[22] Filed: Dec. 5, 1978

[51] Int. Cl.³ .............................................. G06F 3/14
[52] U.S. Cl. ............................ 340/712; 340/365 C; 340/562
[58] Field of Search ................... 340/712, 365 C, 562; 200/DIG. 1

[56] References Cited

U.S. PATENT DOCUMENTS

| | | | |
|---|---|---|---|
| 3,482,241 | 12/1969 | Johnson | 340/712 |
| 3,673,589 | 6/1972 | Barrett et al. | 340/562 |
| 3,757,322 | 9/1973 | Barkan et al. | 340/712 |
| 3,947,696 | 3/1976 | Larson et al. | 340/365 C |
| 4,037,221 | 7/1977 | Alexander | 340/562 |
| 4,090,092 | 5/1978 | Serrano | 200/DIG. 1 |
| 4,110,749 | 8/1978 | Janko et al. | 340/712 |
| 4,145,748 | 3/1979 | Eichelberger et al. | 340/365 C |

Primary Examiner—Marshall M. Curtis
Attorney, Agent, or Firm—Hill, Van Santen, Steadman, Chiara & Simpson

[57] ABSTRACT

A data input device for use in an electrically noisy environment incorporates a plurality of conductive strips, arranged in rows and columns, mounted on a transparent body in front of a display device. Electrical noise is induced constantly in the conductive strips. When an operator places his finger in close association with one or more of the rows and columns, the amplitude of the electrical noise on such strips changes markedly. The change in noise level is detected and used to provide an output identifying the row and/or column in the vicinity of the operator's finger.

13 Claims, 6 Drawing Figures

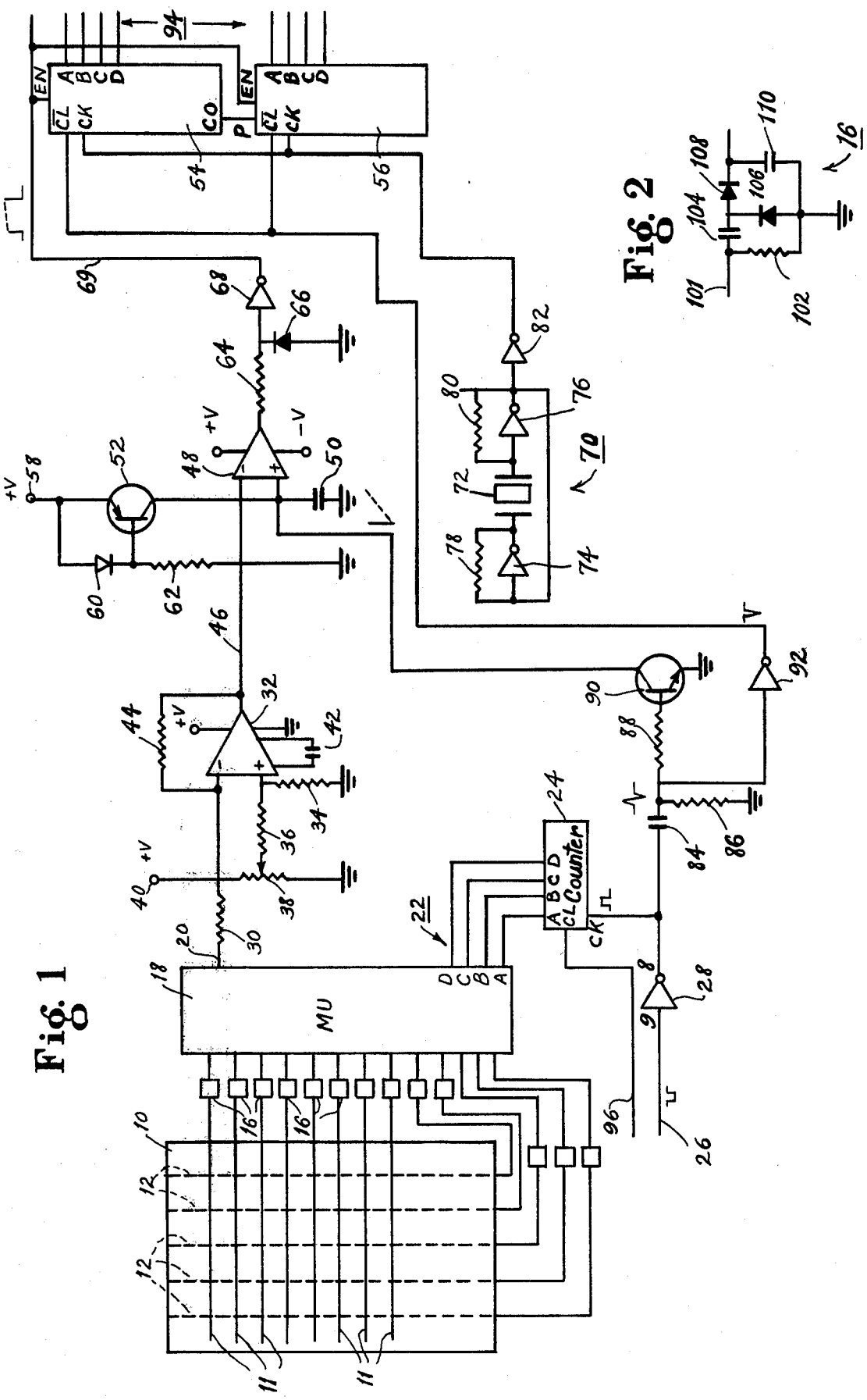

NOISE RESPONSIVE DATA INPUT APPARATUS AND METHOD

BACKGROUND

1. The Field of the Invention

The present invention relates to data input devices and methods, and more particularly to such devices and methods which may be used with display devices.

2. The Prior Art

Display devices are used in a large variety of equipment, for displaying data, messages, instructions, etc. Some of these devices operate in an interactive mode, in which displayed instructions are designed to help the operator perform a desired sequence of operations. For example, when the apparatus is employed as a part of an automatic teller machine, the instructions visible on the display inform the operator of the correct sequence in which to enter his account number, the type of transaction, the amount of the transaction, etc. In the past, it has been customary to provide a set of keys or pushbutton switches, by which the operator may make data entries into the system, or to select one or another program of operations. While the use of separate switches has been generally satisfactory, in enabling the apparatus to perform the intended function, the necessity of providing a separate set of switches or a keyboard increases the size of the overall apparatus, and also reduces the speed with which it may be operated, since the operator's eyes must be diverted from the display to the keyboard and back to the display at frequent intervals. In addition, separate switches must be labeled, and the labels are not readily changeable.

Because of the large amount of electrical noise inherent in the operation of plasma display, it has been considered to be impractical to employ any type of capacitive sensing involving the juxtaposition of a finger of an operator with the exterior surface of the display panel itself. It has been found, however, that the very presence of the noise itself may be utilized in determining the position of an operator's finger, in relation to the display panel. In addition, the present invention is usable with other types of display devices by providing a source of electrical noise for the input device.

BRIEF DESCRIPTION OF THE INVENTION

It is a principal object of the present invention to provide a touch input for a display panel, which is integrally connected with the components of the display panel itself.

Another object of the present invention is to provide an apparatus and method for sensing the position of an operator's finger in relation to a display panel, by sensing the amount of electrical noise which is present on a series of terminals.

A further object of the present invention is to provide a simple and effective way of allowing an operator to designate a particular location of display panel by bringing his finger into juxaposition with that location.

By use of the present invention, an interactive program may be carried out involving the use of a display panel, in which messages or instructions are given to the operator by displaying them on the display panel. The instructions may request the operator to designate one or another of a number of available programs by bringing his finger into juxtaposition with a designated location on the display panel itself, indicated visually by the way in which the display is illuminated.

This makes the apparatus very easy to use, because the operator can place his finger at the correct position relative to the display panel without removing his eyes from the display. It also reduces the size and complexity of the structure which is required to make the apparatus function.

In one embodiment of the present invention, there is provided a transparent plate adapted to be positioned in front of a plasma display device, having conductive strips in rows and columns applied to the front and rear surfaces of the plate, means for sequentially scanning the rows and columns for sensing electrical noise which may be picked up by the strips, and means for sensing a change in intensity of one of said rows and one of said columns as an operator places his finger in juxtaposition with the display panel.

These and other objects and advantages of the present invention will become manifest by an inspection of the following description and the accompanying drawings.

BRIEF DESCRIPTION OF THE DRAWINGS

Reference will now be made to the accompanying drawings in which:

FIG. 1 is a schematic circuit diagram, partly in functional block diagram form, showing an illustrative embodiment of the present invention;

FIG. 2 is a schematic diagram of a portion of the apparatus of FIG. 1;

DESCRIPTION OF THE PREFERRED EMBODIMENT

Figure 3:
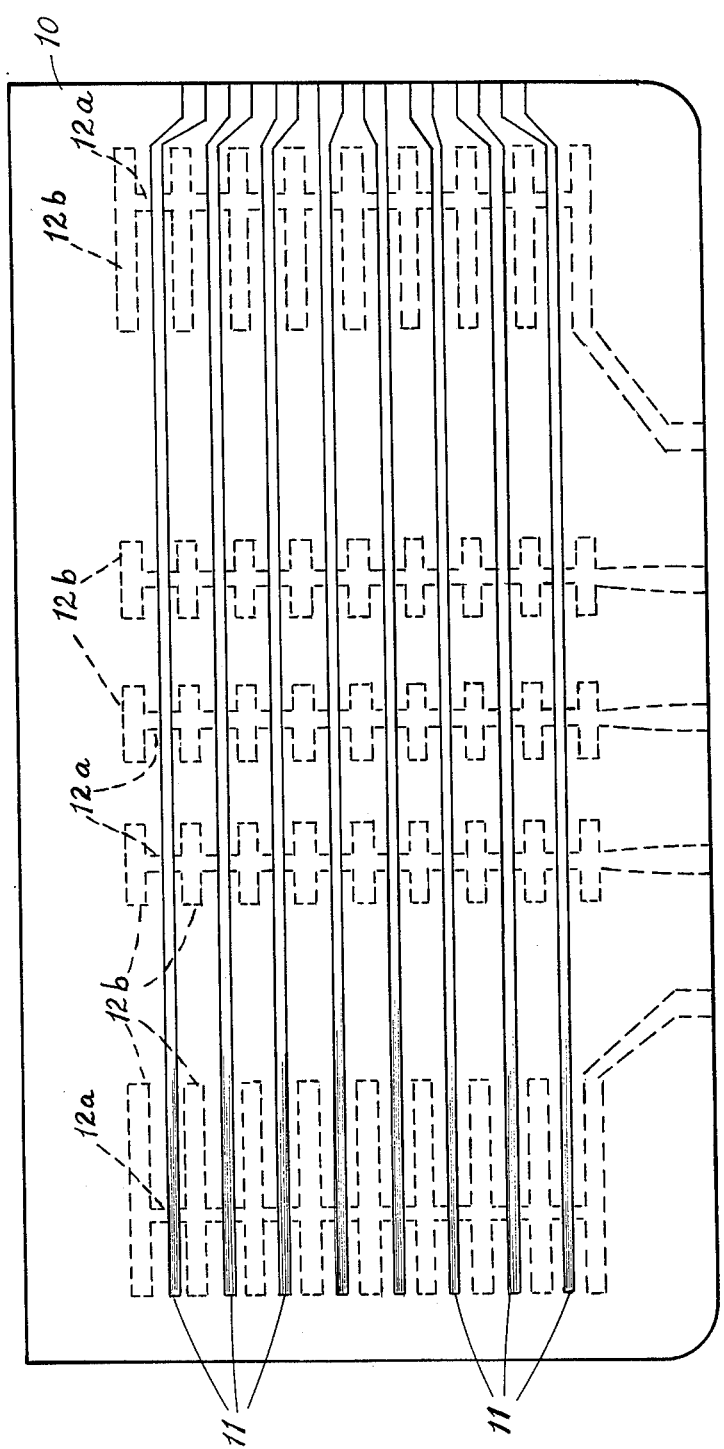
FIG. 3 is a plan view of a portion of the display panel adapted for use with the present invention.

Referring now to FIG. 1, there is illustrated an illustrative embodiment of the present invention adapted for use with a transparent panel supported in front of a plasma display device. The transparent panel is provided with a plurality of strips of conductive material arranged in rows 11 on one side of the panel and columns 12 on the other side of the panel 10. The strips are so thin that they are transparent, and the display may be viewed through the panel and through the strips. The panel 10 itself is also very thin and is preferably about 1/16th of an inch. It is preferably formed of glass or some other transparent material which has very good insulating properties. Each of the strips is connected to a detector unit 16 which derives an electrical signal which is a function of the amplitude of the noise present on the strip. The noise appears on the strips because they are long enough to function as antennas for electrical noise which is radiated in the space around them. The circuit employed for the detectors 16 is illustrated in FIG. 2 and is described in more detail hereinafter.

The outputs of each of the detectors is connected to individual inputs of a multiplex unit 18 which functions to select one of the inputs from the several detector units 16 and connect one of them to an output terminal 20. The particular input which is connected to the output terminal 20 at any given time is controlled by a plurality of select inputs 22 which are connected to corresponding outputs of a counter 24. A source of clock pulses is provided on a line 26, and the line 26 is connected through an inverter 28 to the clock input of the counter 24, so that the counter 24 is advanced by a count of one for each clock pulse arriving on the line 26. In this way, the multiplex unit 18 is caused to scan all of its inputs, which are connected to the several detectors 16, repetitively and in succession. The identity of the particular input connected to the output terminal 20 at any given time is represented by signals present at the output terminals of the counter 24.

The output terminal 20 is connected through a resistor 30 to the inverting input of a buffer amplifier 32. The non-inverting input of the buffer amplifier is connected to ground through a resistor 34 and through a resistor 36 to the tap of a potentiometer 38, connected between ground and a source of positive potential at a terminal 40. The potentiometer 38 is adjusted for selecting the desired bias of the buffer amplifier 32. A capacitor 42 is provided for frequency compensation, and a resistor 44 is connected between the output of the amplifier 32 and its inverting input, in order to establish the gain of the amplifier.

The output of the buffer 32 is available on a line 46, which is connected to the input of an analog-to-digital converter, incorporating a voltage comparator 48, an integrating capacitor 50, a transistor 52 functioning as a current source, and a counter incorporating binary counter units 54 and 56 connected in cascade. In operation, the voltage comparator 48 compares a voltage on the line 46 with the voltage across the integrating capacitor 50, which increases linearly as a result of current from the transistor 52. The collector of the pnp transistor 52 is connected to the ungrounded terminal of the capacitor 50, and its emitter is connected to a source of positive potential at a terminal 58. A diode 60 is interconnected between the base and emitter terminals of the transistor 52, to bias the transistor, and the base of the transistor is connected to ground through a resistor 62.

The output of the voltage comparator 48 is connected through a resistor 64 and a diode 66 to ground, the diode 66 functioning to clamp the voltage appearing on its cathode at ground potential.

As long as the potential across the capacitor 50 is less than the voltage appearing on the line 46, the output of the voltage comparator 48 is low, and the voltage level at the junction of the resistor 64 and the diode 66 is clamped to ground by the diode 66. As the voltage across the capacitor equals and surpasses the voltage on the line 46, the output of the voltage comparator 48 goes high, and remains high until the operation is reset by discharging the capacitor 50 as described below.

The time interval during which the output of the voltage comparator 48 is low corresponds to the value of the voltage on the line 46, and this is converted into a digital representation of the voltage by means of the counter incorporating the units 54 and 56.

The junction of the resistor 64 and the diode 66 is connected through an inverter 68 to the enable inputs of the units 54 and 56, and while the enable input is high, the counter units 54 and 56 are operational to count pulses produced by a pulse generator 70. The pulse generator 70 is a crystal oscillator having a crystal 72 and a pair of inverters 74 and 76 with feedback resistors 78 and 80. The output of the oscillator is connected through an inverter 82 to the clock inputs of the counter units 54 and 56, for furnishing a high frequency stream of pulses to the counters. This stream of pulses is counted during the period in which the output of the inverter 68 is high.

Operation is initiated by a clock pulse arriving on the line 26. This pulse is differentiated by a circuit including a capacitor 84 and a resistor 86, and passed through a resistor 88 to the base of a transistor 90, the collector and emitter terminals of which are connected across the capacitor 50. Accordingly, the capacitor 50 is discharged through the transistor 90 very rapidly at the beginning of the clock pulse, for a short duration determined by the differentiating circuit including the capacitor 84. This reduces the voltage across the capacitor 50 to zero, after which it increases at a linear rate controlled by the transistor 52.

The output of the differentiator is connected through an inverter 92 to the clear terminals of the counter units 54 and 56, causing these units to be cleared to zero at the same time the capacitor 50 is discharged.

At the same time as the resetting of the counter units 54 and 56, the multiplexer 18 selects an input from one of the detectors 16, and passes it to the line 46. The capacitor 50 is charged until the voltage on the line 46 is reached, during this interval, the counting units 54 and 56 are adapted to count the cycles of the pulse generator 70. When equality is reached, the output of the inverter 68 goes low, disabling the counter units 54 and 56, and causing them to manifest on their output terminals 94 a digital representation of the voltage level produced by the selected detector 16. This digital representation continues to be manifested on the output terminals 94 until the beginning of the next cycle, initiated by a subsequent clock pulse on the line 26.

Preferably, the clock pulse on the line 26 originates with an external computer (not shown in FIG. 1), and the outputs 94 are also connected to the computer. The outputs 94 serve to provide the computer with data representing the state of the selected detector 16, identified by the outputs of the counter 24. While the outputs of the counter 24 may also be supplied to the computer, this is not necessary because the clock pulses on the line 26 are supplied by the computer and an independent count of the clock pulses may be maintained in the computer. In order to insure that synchronism is maintained, the counter 24 is reset periodically by a signal on the line 96, which also originates with the computer. Since the state of the counter 24 is zero after a reset pulse on the line 96, and successive clock pulses on the line 26 count up from zero, the computer is able to maintain a count of the clock pulses following the last reset pulse so that the detector 16 currently being scanned can be identified.

Referring to FIG. 2, the structure of a detector unit 16 is illustrated. Since all of the detector units 16 are identical, a description of one suffices for all. One of the conductive strips 101 is connected through a resistor 102 to ground, and through a capacitor 104 to the cathode of a diode 106, and the anode of a second diode 108. The anode of the diode is also connected to ground. The cathode of the diode 108 is connected to one terminal of a capacitor 110, the other terminal of which is grounded. A DC output voltage is available at the ungrounded terminal of the capacitor 100, which corresponds to the amplitude of the noise on the strip 101.

In operation, the detector circuit of FIG. 2 responds to both positive-going and negative-going half cycles of the composite noise signal. The negative-going half cycles are effective to charge the capacitor 104 through the diode 106, and cycles of opposite polarity are effective to charge the capacitor 110, through the capacitor 104, with the voltage across the capacitor 104 adding to the positive-going noise signal while charging the capacitor 110. The value of capacitance of the capacitor 104 is selected to be equal to about 1/10th of that of the capacitor 110, so that a number of cycles of operation are required for the capacitor 110 to accumulate a steady state charge proportional to the noise signal appearing on the conductive strip 101. The charge on the capacitor 110 is slowly dissipated as a result of the input impedance of the multiplexer 18, and the impedance of input and feedback circuits of the voltage comparator 48. Preferably, the impedance of the voltage comparator 48 is selected to be very high, so that only a small value of capacitance is required for the capacitor 110.

In operation, the capacitor 110 assumes a value which follows the peak voltage of the noise signals applied to the input of the detector 16 from its respective conductive strip 101. If the peak value changes, the output of the detector 16 changes at a rate determined by its RC time constant. It is desirable to choose the time constant such that the random variations inherent in the noise signals being detected do not result in rapid variations in the output level, but the output level does respond to a marked reduction in the noise level when an operator brings a finger into juxtaposition with one of the conductive strips. When this occurs, the reduction in the peak voltage of the noise signals detected by the corresponding detector unit 16 produces a substantially lower voltage on the line 46, and the digital output on the output terminals 94 is representative of that lower value. The data on the output terminals 94 is utilized by the external computer to sense that an operator's finger has been placed into juxtaposition with the display panel, and the position of the finger is identified by the state of the counter 24 at the times that the finger pressure is sensed.

FIG. 3 illustrates a plan view of the display panel constructed in accordance with the present invention, and adapted to function with the circuit of FIG. 1. A plurality of conductive strips 11 in equally spaced rows are provided across the front face of the insulating panel 10, which is the side closest to an operator. The strips 11 are thin elongate strips, and one end of each of the strips is connected to the circuitry of FIG. 1 preferably by means of two connectors (not shown) which engage the ends of the strips at the bottom and right-hand side as shown in FIG. 3. Alternatively, the strips may be soldered or otherwise permanently connected to conductors which are connected to the input of the detector units 16. In desired, thin wires may be used instead of strips.

In the embodiment of FIG. 3, there are five strips for the columns, each of which is represented by a vertical conductive strip 12a with short horizontal segments 12b aligned with the spaces between the row strips 11 on the front face of the panel 10. The column strips are applied to the rear face of the panel 10. The width of the column strips is reduced at places aligned with the row of strips 11 on the front face of the panel 10, to reduce interaction between the strips forming the rows and columns. The short, horizontal strips connected at regular intervals to the vertical column strips increase the effective area of the vertical strips, to enable the sensitivity of the vertical strips on the back face of the panel to approximately equal the sensitivity of the horizontal strips on the front face of the panel. An increase in area is required to achieve equal sensitivity, because the strips on the back face of the panel are further away from the operator's finger. Preferably, a thin layer overlies the panel 10, and serves to protect the panel 10 and the horizontal strips on its front face from wear and damage. The protective layer may be either a separate transparent panel, or a transparent coating applied to the front face of the panel 10.

It has been found that by using a panel of the type illustrated in FIG. 3, the circuit of FIG. 1 is able to generate digital output signals which differ markedly from each other in accordance with the presence or absence of an operator's finger in position on the panel.

In determining the presence of an operator's finger in position on the panel, a number of variables must be taken into consideration by the external computer. Firstly, the signals produced by the various detectors 16 are not identical for all rows and columns, but vary with the information currently being displayed by the display device. When information is currently being displayed at only one portion of the display device, a greater amount of noise is induced in the strips for the rows and columns which pass closest to this location, than in the other strips. When the message or information being displayed changes, a different set of row and column strips may receive a relatively greater amount of noise. Accordingly, it is necessary to compensate for changes in the output signals produced during a change in information being displayed.

A more gradual, but also significant, change in the ouput signal from the detector units 16 results from varying ambient conditions in the vicinity of the display apparatus. Since the apparatus of FIG. 1 is responsive to noise, the presence of an external noise source influences the values derived from the detectors 16. This effect may be discriminated against in two ways. First, the relative amount of change in the digital output signals of the various rows and columns are compared with each other, and if it is found that a majority of the rows and columns experience a contemporaneous increase or decrease, it may be concluded that the change in values is due to a gross ambient condition rather than to the placement of an operator's finger. Secondly, only relatively sharp decreases in output voltage are representative of finger placement, and more gradual changes may be disregarded as being due to gross ambient conditions and not to finger placement.

When an operator first approaches the panel, for example, a gradual change in all the outputs results. This affects the noise level detected on all of the rows and columns approximately equally, and is also relatively slow in the effect of its rise or fall.

When an operator places his finger in position on the face of the display panel, a relatively sharp decrease in output voltage level is sensed by the detectors 16. It is therefore possible to use the rate of decrease of the voltage sensed by the detectors 16 in order to positively identify a finger in position on the disply panel.

Figure 6:
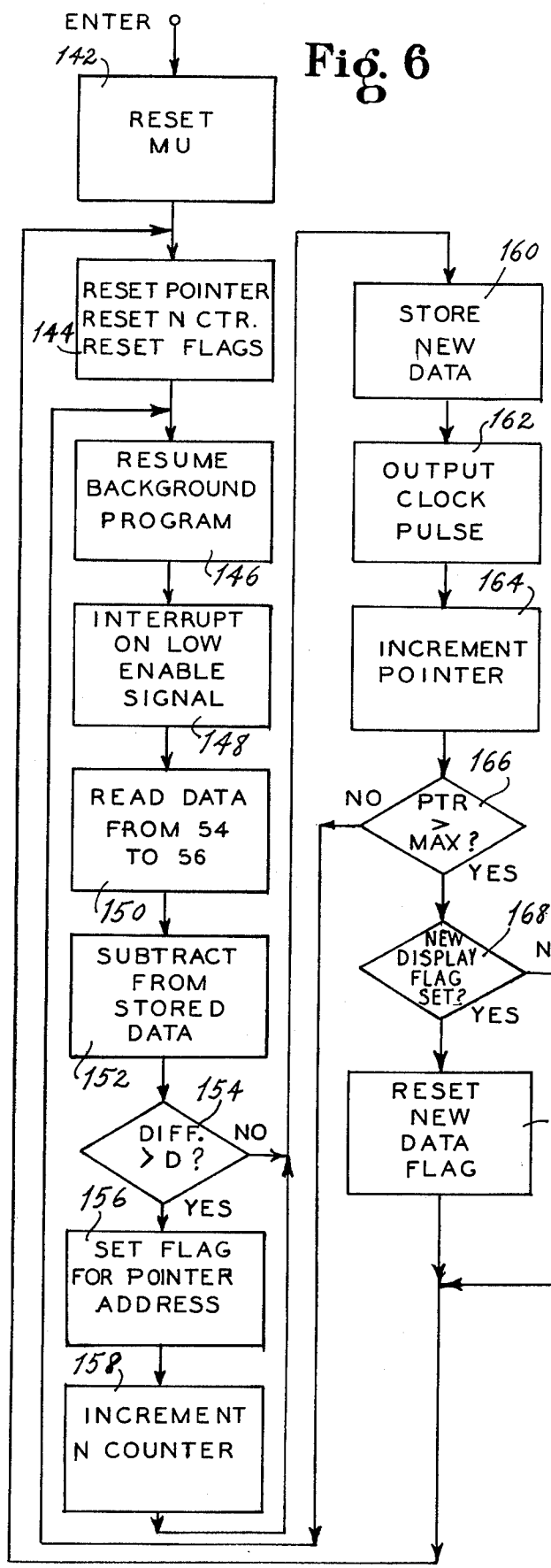
FIG. 6 is a flow chart of a program which may be performed by the apparatus of FIG. 4 or 5.

FIG. 6 illustrates an illustrative program which may be carried on by an external computer in association with apparatus of the present invention, so that the X-Y coordinates of a finger placement may be determined, and environmental changes, and gross changes in input levels resulting from the approach of the operator to the display panel may be disregarded.

Figure 4:
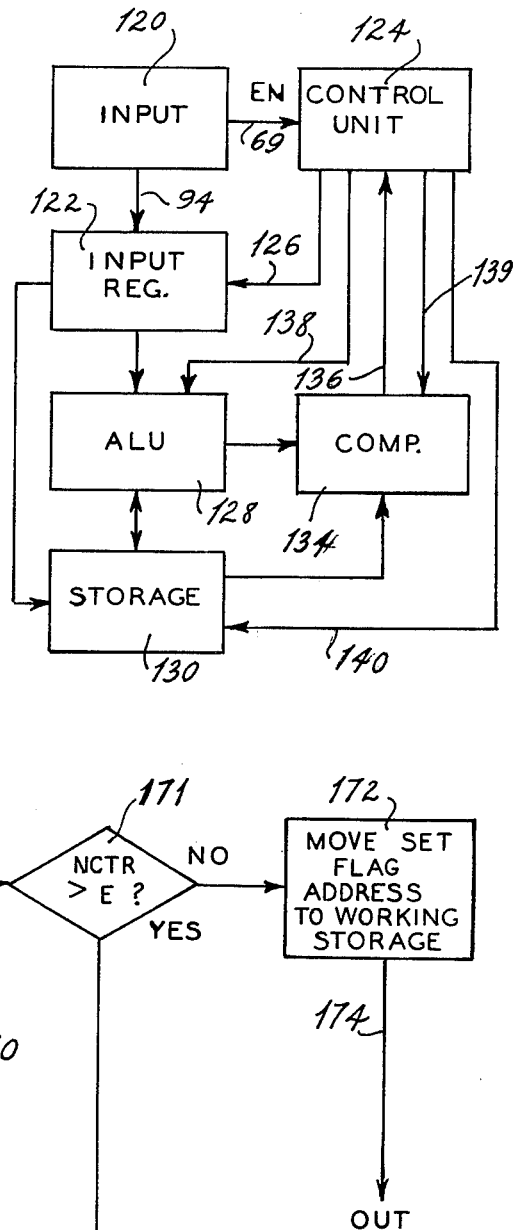
FIG. 4 is a functional block diagram of apparatus associated with the apparatus of FIGS. 1-3.

FIG. 4 illustrates a functional block diagram of apparatus which may be associated with the input apparatus illustrated in FIGS. 1 to 3, and which can carry out the program of FIG. 6. The input device of FIGS. 1–3 is illustrated by a block 120, having its output terminals 94 connected to an input register 122, which receives data from the counting units 54 and 56 when the enable signal produced by the inverter 68 (FIG. 1) goes low. The enable signal on the line 69 is connected to a control unit 124, which responds to the enable signal being low on line 69 in order to write the data into the input register 122, under control of a signal over a line 126. The input register 122 is connected to an ALU 128, and to a storage unit 130, so the data from the input register can be transferred to either the ALU or to the storage unit. Data can be transferred from the storage unit to ALU also. The ALU 128 and the storage unit 130 are both connected to a comparator unit 134, so that the output of the ALU may be compared with data stored in the storage unit 130. The result of the comparison is made available at the control unit 124 by a signal on a line 136. Lines 138–140 furnish signals required for controlling operation of the ALU 128, the comparator 134, and the storage unit 130.

It is preferred that the apparatus of the present invention be used with a computer processing unit such as a microprocessor or MPU, but apparatus in the form of individual integrated circuits or discrete components may be used as well. The specific circuitry of such apparatus is not described in detail, because the required circuitry will be obvious to those skilled in the art from a review of FIG. 6.

The program of FIG. 6 is entered by passing control to a unit 142 which functions to produce a pulse on the line 96 which resets the counter 24. The block 142, as well as the other blocks of the flow chart of FIG. 6, is representative of both the function of resetting the multiplexer, and also of the apparatus required to execute that function. The blocks are accordingly referred to as units. The rectangular units of FIG. 6 are indicative of operational devices, and the diamond-shaped units represent decision units.

When the unit 142 has executed its function, control is passed to a unit 144, which functions to reset a pointer, reset an N counter, and reset a plurality of flags. The pointer, the N counter and the flags are preferably all specific memory locations within the storage unit 130. The pointer constitutes a counter which maintains data representative of the state of the counter 24, so that it is not necessary to furnish the signals on the output terminals of the counter 24 to the computer. It is reset at the same time that the counter 24 is reset by a pulse on the line 96, so that the computer can keep track of the strip of the matrix panel currently being scanned.

The N counter is a location within the storage unit 130 which identifies the number of horizontal and vertical strips for which significant differences have been detected during a given period of time. This counter is employed to distinguish between valid inputs indicating a placement of an operator's finger, and invalid inputs which are due to ambient conditions and which affect the outputs of most or all of the detectors 16. The flags are also preferably at specific locations within the storage unit 130, one such location being provided for each of the separate conductive strips of the panel 10. A flag for an individual strip is set when the voltage produced by its corresponding detector is recognized as being lower than normal by more than a predetermined amount.

Following operation of the unit 144, control is passed to the unit 146, which enables the computer to resume a background program if necessary during the period that the capacitor 50 is being charged up by action of the current source transistor 52. The end of this period is signified when the voltage level on the line 69 goes low. At this time, the unit 148 receives control and interrupts the background program in execution, if any, and passes control to the unit 150. The unit 150 writes the data from the counter units 54 and 56 into the input register 122, and then a unit 152 causes the new data to be subtracted from the old data stored in a storage location in the storage unit 130 associated with the conductive strip currently being sensed. Control is then passed to the unit 154 which determines whether the difference is greater than a predetermined value D, also stored in the storage unit 130. This comparison may be effected by the unit 134 (FIG. 4). If the difference is greater than D, a finger placement is recognized as likely, and a unit 156 receives control which sets the flag associated with the pointer address designating the conductive strip currently being scanned. The N counter is then incremented, by a unit 158, and control is passed to a unit 160.

If the unit 154 determines that the difference is not greater than D, it is recognized that the difference, if any, is due to ambient conditions, and the units 156 and 158 are by-passed, control being passed directly to the unit 160.

The unit 160 functions to place the new data from the input register into the storage locations in the storage unit 130 corresponding to the conductive strip being scanned, so that the data maintained in the storage unit 130 is updated. Then a unit 162 produces an output clock pulse on the line 26 of FIG. 1, to increment the counter 24 and initiate sensing of the next conductive strip. A unit 164 then increments a pointer, to keep track of the content of the counter 24 and passes control to the unit 166. The unit 166 determines whether the pointer is greater than a maximum value corresponding to the total number of conductive strips in the panel 10. If it is not, some of the strips remain to be sensed, and control is returned to the unit 146, so that the sequence described above beginning with 146 and ending with 166 is repeated. When all of the conductive strips have been scanned, the N counter stores the number of strips for which significant differences have been detected, and the flags for those strips have been set.

When all the strips have been scanned, control is passed from the unit 166 to a unit 168 which inspects the condition of the new display flag. The new display flag is a portion within the storage unit 130 which is set (by means not shown) each time the information displayed by the display unit is changed. Because the presence of new information may influence the outputs of the detector units 16, an indication of finger placement during the next following scan must be ignored. Accordingly, control is passed to a unit 170 which resets the new data flag and returns control to the unit 144, which begins a second cycle during which all of the conductive strips are scanned.

At the end of the second cycle, control is passed from the unit 168 to a unit 170, which examines the state of the N counter and determines whether it is greater than a predetermined value E. The value E is a stored number corresponding to the maximum number of conductive strips which may have significant differences in their output voltage levels as a result of an actual placement of an operator's finger. If more than this number of strips have been recognized with significan differences in their voltage levels, the difference is recognized as being a change in ambient conditions, and not a placement of an operator's finger. Under these circumstances, control is returned to the unit 144, which repeats the cycle of operation described above. If the N counter stores a number which is not greater than E, control is passed to the unit 172 which operates to move the addresses associated with the flags which have been set to a working storage area of the storage unit 130, where they are available to the computer for use in subsequent programs. These addresses identify the conductive strips nearest the operator's finger. Control is then passed out over a line 174 to the next unit to receive control in a subsequent program.

In operation of the apparatus of the present invention, during a finger placement, there typically are two conductive strips which are sensed as having significantly lower voltage levels than during the previous scan. They correspond to the row and column nearest the finger placement. The intervals of the scans can be adjusted by selecting the frequency with which a program illustrated in FIG. 6 is entered. This may be under the control of the external computer and is accomplished by conventional means and therefore need not be described in detail. In some circumstances, however, the operator may place his finger adjacent a row which is not near a column conductor, and in this event, only one strip will be recognized as having a significantly lower potential. This can be ignored by a suitable arrangement in which the decision unit 170 ignores a condition in which the content of the N counter is 1. It may be utilized, if desired, to flash a different display on the screen instructing the operator to place his finger correctly. When the operator's finger is placed over one of the column conductors intermediate between two row conductors, three strips may be recognized as having significantly lower potentials. This is a valid input condition, provided that the two rows are adjacent each other. A test for adjacency of the rows with significantly lower potential can be provided if desired, in order to reject inputs which may result from the placing of two fingers at a time and which might cause erroneous operation of the computer.

In the use of apparatus as shown in FIGS. 1-3, a reduction of approximately 20% in the output voltage of the detector units 16 is realized, giving a favorable signal-to-noise ratio since the apparatus of FIGS. 4 and 6 can function if the difference is as low as 2-5%.

Figure 5:
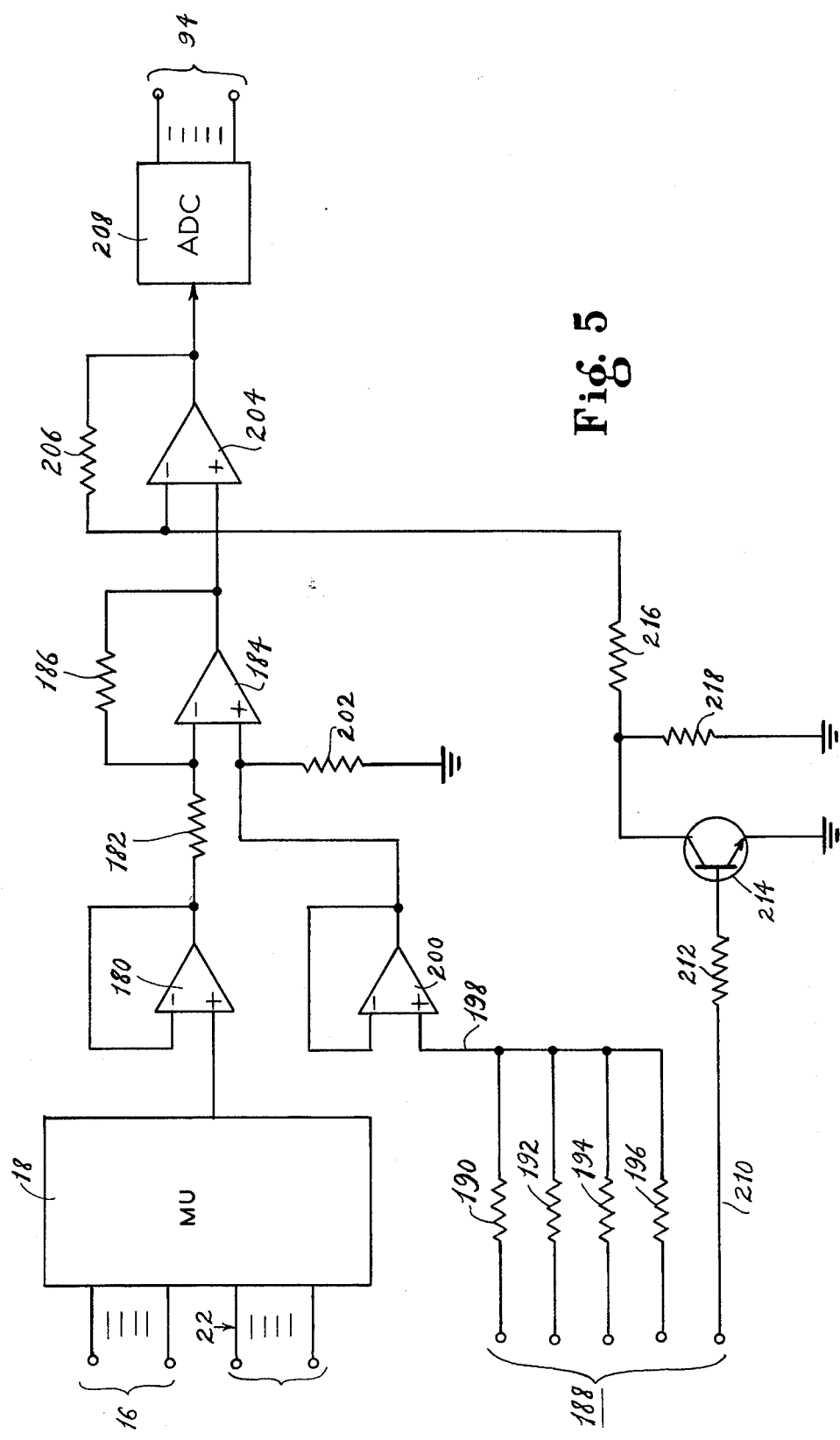
FIG. 5 is a functional block diagram of an alternative embodiment of the present invention.

Referring now to FIG. 5, an alternative embodiment of the present invention is illustrated, which may be preferably in many cases. The lines 22 which control the multiplexer 18 are controlled directly by an external computer (not shown) so the counter 24 of FIG. 1 is not required. The output of the multiplexer 18 is connected through a unity gain operational amplifier 180. The amplifier 180 has its output connected directly to its inverting input. The output of the amplifier 180 is also connected through a resistor 182 to the inverting input of an operational amplifier 184. A feed-back resistor 186 is interconnected between the output of the amplifier 184 and its inverting input, to establish its gain.

The signal supplied to the non-inverting input of the amplifier 184 is derived from the computer. A plurality of terminals 188 are connected to the computer, and a digital-to-analog converter incorporating resistors 190-196 are connected to four of these terminals to establish an analog voltage on a line 198 corresponding to the signals applied to the resistors 190-196. These resistors are chosen to have resistance values in the ratio of 1, 2, 4 and 8, so that the binary coded word can cause a predetermined analog voltage to appear on the line 198. It is connected through a unity gain operational amplifier 200 having its output connected directly to its inverting input. The output of the amplifier 200 is connected to the non-inverting input of the amplifier 182, and to ground through a resistor 202.

The signal applied to the non-inverting input of the operational amplifier 184, in effect, selects the bias applied to the amplifier 184, so as to compensate for the fact that certain of the inputs applied through the units 16 to data inputs of the multiplexer have different sensitivities. The circuit incorporating the components 190-202 compensates, individually for each of the signals applied to one of the data inputs of the multiplexer 18, for different amplitudes of such signals. Accordingly, the amplifier 184 produces at its output a signal which is relatively independent of the individual sensitivities of the various row and column pick-ups.

The output of the amplifier 184 is also connected through a non-inverting input of an operational amplifier 204, which has a feedback resistor 206 connected between its output and its inverting input to establish the gain. The output of the amplifier 204 is connected to an analog-to-digital converter 208, the outputs of which 94 are connected to the external computer to supply a digital representation of the analog signal available at the output of the amplifier 204.

Means is provided for controlling the gain of the amplifier 204, and it is controlled by a signal on a line 210, received from the external computer. The line 210 is connected through a resistor 212 to the base of an NPN transistor 214, which has its emitter connected to ground and its collector connected to the inverting input of the amplifier 204 through a resistor 216. A resistor 218 is connected from the collector of a transistor 214 to ground.

A binary signal is applied to the line 210 from the external computer, and causes the transistor 214 to conduct in saturated fashion or to be cut off. When it is cut off, the resistance between the inverting input of the amplifier 204 and ground is the sum of the resistors 216 and 218, while during conduction of the transistor 214, the resistance from the inverting input of the amplifier 204 to ground is represented substantially entirely by the resistor 216. The values of the components associated with the transistor 214 are chosen so that the gain of the amplifier 204 may be selected as either one or two. This, in connection with the other inputs derived from the computer via the terminals 188, helps to maintain the output of the digital-to-analog converter 208 within its dynamic range. In this way, an eight-bit digital-to-analog converter is entirely satisfactory for producing a digital indication of the levels on the various row and column inputs, irrespective of ambient or environmental effects which may cause a change in the sensitivity of the row or column inputs, or in the amplitudes of the signals produced thereby.

It will be appreciated that the signals which are applied to the terminals 188 may be developed by the computer employing the same techniques which have been described in connection with FIG. 6. For example, a program may cause the signals applied to the terminals 188 to be adjusted so as to keep the output of the digital-to-analog converter 208 in approximately the center of its range, or near one end of its range if that is more desirable. If one or more of the row and column signals changes, because of different environmental effects, corresponding changes can be made in the signals applied to the terminal 188, to maintain the output of the digital-to-analog converter in a condition which facilitates sensing of the placement of an operator's finger in association with one of the row or column pick-ups.

The arrangements illustrated in FIGS. 4-6 are to be regarded as merely illustrative means by which the present invention may be carried out. It is apparent that various modifications and additions may be made to the apparatus and method of the present invention without departing from the essential features of novelty thereof, which are intended to be defined and secured by the appending claims.

When the apparatus of FIG. 5 is employed, it is preferred that a program be used to periodically recalibrate the sensitivity of the several lines and columns. The recallibration program scans all of the rows and columns, in turn, and for each one, determines the permutation of the terminals 188 which must receive high or low potentials in order to generate a digital output 94 of a predetermined value. Such a permutation may be called a sensitivity word. The sensitivity words for the various rows and columns are stored in the storage device 130 (FIG. 4), and each time a given row or column is scanned, its respective sensitivity signals are applied to the terminals 188, so that the output 94 may be compared to a constant value. This enables the simplification of the program of operations as described in connection with FIG. 6. The sensitivity words are determined periodically by applying signal combinations to the terminals 188 which progressively raise or lower the sensitivity, in order to produce a standard output.

In some cases, it is desirable to scan the rows downwardly, when determining finger placement, because a finger placed on the display at an angle may produce different levels in several rows, while only the top row is intended to be selected.

In another embodiment, which is preferrable for many applications, the rear surface of the apparatus of FIG. 3 is placed near a conductive sheet, separated therefrom by an insulating sheet, and the conductive sheet is connected to a noise generator. A suitable noise generator is a signalgenerator producing a square wave signal having a frequency of about 300 to 400 kHz. The conductive sheet is preferably thin enough to be substantially transparent, so the display may be viewed therethrough, and the insulating sheet is also transparent. The conductive sheet need not cover the entire rear surface of the apparatus, but preferably covers the areas corresponding to finger positions which are to be identified. It may be electrically connected to the noise generator via a connection at one of the edges of the unit, like the rows and columns.

When the noise generator is employed, the noise signals are generally of constant amplitude, and so there is less variation with ambient conditions as when they are not used. When a plasma display is employed, the noise generator signal swamps out the noise generated by the display. The present invention is not restricted to noise producing displays, however, when the noise generator is employed, and may be employed with any other type of display. For example, the apparatus of FIG. 3, with the conductive rear sheet connected to a noise generator, may be fabricated of a sandwhich of several transparent plastic sheets, each sheet having the appropriate conductive patterns or areas on its rear surface, and in that form could be placed on the surface of a CRT in a display terminal or even a television picture. When thin sheets of transparent plastic, such as 0.35 mm Mylar, the entire sandwich is flexible, as well as transparent. The location of the display which is touched is determined in the manner described above, and may be correlated with the data or picture then being displayed. The so called "soft keys" of a data terminal may be represented on a screen and the present invention used to determine which soft key is operated.

When the apparatus of FIG. 3 is employed, the positions to be sensed may be placed relatively close together, if desired, because only an area of about 1 cm square is required in order to detect reliably placement of a finger.

What is claimed is:

1. A data input device associated with a display unit comprising:
    a thin, transparent member positioned in front of said display unit,
    a plurality of elongate transparent conductive strips mounted in spaced-apart relation on one side of said transparent member,
    a second plurality of elongate transparent conductive strips mounted in spaced-apart relation on the other side of said transparent member,
    portions of said first and second conductive strips being aligned with each other in a direction normal to the face of said display unit at a plurality of spaced-apart locations; and
    detector means continuously connected to at least one of said conductive strips for producing an electrical signal in response to the level of ambient electrical noise present on said conductive strip,
    whereby placement of a finger by an operator into a position close to one or more of said strips causes said detector means to change the value of said electrical signal, irrespective of the presence of ambient noise radiation.

2. Apparatus according to claim 1, including a separate detector for each of said strips, for producing a plurality of output signals responsive to electrical noise on said strips, and means for sequentially scanning said output signals, said scanning means connecting each of said output signals in turn to an output terminal.

3. Apparatus according to claim 1, including an analog-to-digital converter connected to said detector means for providing a digital representation of the noise level present on said strip.

4. Apparatus according to claim 1, wherein said detector comprises means for developing a signal representative of a time-weighted average value of said noise.

5. Apparatus according to claim 4, including means for developing a time-weighted average value of both positive-going and negative-going half cycles of said noise.

6. Apparatus according to claim 1, wherein said display unit is a plasma display device.

7. A method of detecting the presence of a human finger juxtaposed with the surface of a display device comprising the steps of providing an elongate conductive strip at a location aligned with the face of the display device at a position which may be approached by an operator3 s finger, and continuously detecting the quantity of electrical noise present on said conductive strip, whereby a significant change in said electrical noise is representative of the approach of said finger, and further including the steps of periodically producing a digital representation of said electrical noise, storing at least one of said digital representations, comparing said first digital representation with a second digital representation of said noise, developing a signal representative of the difference between said first and second digital representation, comparing said difference-representative signal with a fixed value, and developing an output signal as the result of said comparison.

8. For use in a data process input apparatus, the combination comprising a thin, transparent insulating plate, a first plurality of thin, transparent elongate conductive strips mounted on the front face of said plate in spaced-apart relationship, and a second plurality of thin, transparent elongate conductive strips mounted on the rear face of said plate in crossing relationship with said first plurality, said second plurality of strips each having a short section located between strips of said first plurality and extending in a direction generally parallel with said first plurality, the width of said short sections being such that the effective area of the strips of said second plurality is increased to increase the sensitivity of the strips of said second plurality to approximately equal the sensitivity of the strips of said first plurality to the approach of an operator's finger.

9. Apparatus according to claim 8, wherein said plate is composed of glass and is approximately 1.5 mm thick.

10. Apparatus according to claim 1, including a transparent conductive panel juxtaposed with said member and connected to a source of a high frequency electrical signal.

11. Apparatus according to claim 10, including a transparent insulating sheet separating said panel from said member.

12. Apparatus according to claim 1, including means connected to said detector means for controlling the sensitivity of said detector in accordance with a value which is predetermined for said strip.

13. Apparatus according to claim 12, including means for periodically comparing said electrical signal with a predetermined signal and adjusting said value accordingly.

* * * * *